(12) United States Patent
Hikita et al.

(10) Patent No.: US 6,507,117 B1
(45) Date of Patent: Jan. 14, 2003

(54) SEMICONDUCTOR CHIP AND MULTICHIP-TYPE SEMICONDUCTOR DEVICE

(75) Inventors: Junichi Hikita, Kyoto (JP); Hiroo Mochida, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/493,249

(22) Filed: Jan. 28, 2000

(30) Foreign Application Priority Data

Jan. 29, 1999 (JP) ............................................ 11-022690

(51) Int. Cl.[7] ........................ H01L 23/48; H01L 23/52; H01L 29/40
(52) U.S. Cl. ...................... 257/778; 257/787; 257/796; 361/56
(58) Field of Search ................................ 257/778, 788, 257/666, 787, 692, 796, 667, 676, 784; 361/56, 118; 307/125, 130, 131

(56) References Cited

U.S. PATENT DOCUMENTS

| | | | | |
|---|---|---|---|---|
| 5,334,857 A | * | 8/1994 | Mennitt et al. | ............... 257/48 |
| 5,506,499 A | * | 4/1996 | Puar | ........................ 324/158.1 |
| 5,528,083 A | * | 6/1996 | Malladi et al. | ............. 257/786 |
| 5,696,031 A | * | 12/1997 | Wark | .......................... 437/209 |
| 5,719,440 A | * | 2/1998 | Moden | ........................ 257/697 |
| 5,751,015 A | * | 5/1998 | Corbett et al. | ................. 257/48 |
| 5,754,410 A | * | 5/1998 | Bardsley et al. | ............. 361/777 |
| 5,767,527 A | * | 6/1998 | Yoneda et al. | ................. 257/48 |
| 5,838,163 A | * | 11/1998 | Rostoker et al. | ............ 324/763 |
| 6,180,426 B1 | * | 1/2001 | Lin | ............................. 438/15 |
| 6,198,136 B1 | * | 3/2001 | Voldman et al. | ............ 257/357 |

* cited by examiner

Primary Examiner—Elvin Enad
Assistant Examiner—Kyung Lee
(74) Attorney, Agent, or Firm—Rader, Fishman & Grauer PLLC

(57) ABSTRACT

A semiconductor chip having an internal circuit formed on a semiconductor substrate and a chip connection pad formed on the semiconductor substrate and used for interchip connection to another semiconductor chip. Further formed on the semiconductor substrate are an other-service-than-interchip-connection pad used for other service than interchip connection, and a switching circuit for selectively connecting, to the internal circuit, the chip connection pad or the other-service-than-interchip-connection pad.

16 Claims, 6 Drawing Sheets

SEMICONDUCTOR CHIP AND MULTICHIP-TYPE SEMICONDUCTOR DEVICE

BACKGROUND OF THE INVENTION

1. Field of the Invention

The present invention relates to a semiconductor chip having a protective circuit prepared for an input of an abnormal voltage or current supplied from the outside due to static electricity or the like, and also to a multichip-type semiconductor device having semiconductor chips each of which has the arrangement of the semiconductor chip above-mentioned.

2. Description of Related Art

In a multichip-type semiconductor device in which a plurality of semiconductor chips are being resin-molded as connected to one another, the mutual connection of the semiconductor chips is conducted in any of a variety of manners. For example, there are instances where the semiconductor chips are connected to one another by bonding wires. There are also instances where the semiconductor chips are piled up on one another to form a chip-on-chip structure and are electrically connected to one another through bumps. There are also instances where the semiconductor chips are bonded onto a printed circuit board, thus achieving the mutual electrical connection of the semiconductor chips.

Each of the semiconductor chips forming a multichip-type semiconductor device, is provided on the surface thereof with a plurality of pads for electrical connection with another semiconductor chips. The pads are connected to an internal circuit formed on a semiconductor substrate serving as the base body of the semiconductor chip. The semiconductor chip itself can also be used as a single element. In such a case, pads are connected to lead frames which are pulled out to the outside of the package.

FIG. 6 is a block diagram illustrating an electric arrangement relating to a pad 101 of a semiconductor chip 100. The pad 101 is connected to an internal circuit 103 through a wiring 102. In the vicinity of the pad 101, a diode 105 is connected to the wiring 102 between the same and the power line, while a diode 106 is connected to the wiring 102 between the same and the ground. These diodes 105, 106 form a surge protective circuit 104. This surge protective circuit 104 is arranged to absorb a surge entered through the pad 101 from the outside of the semiconductor chip 100, thus preventing the internal circuit 103 from being damaged.

There are instances where an excessive voltage is externally applied to the semiconductor chip 100. For example, an excessive voltage is applied when a functional test is conducted with a test probe applied to the pad 101, before the semiconductor chip 100 is assembled into a multichip-type semiconductor device. Further, when the semiconductor chip 100 itself is used as a single element, there is a likelihood that an excessive voltage due to static electricity is applied to the pad 101 through a lead frame. In such a case, the surge protective circuit 104 is actuated to protect the internal circuit 103.

However, the diodes 105, 106 accompany large parasitic capacitances C1, C2. Accordingly, when it is particularly intended to operate the semiconductor chip 100 at high speed, the power consumption is disadvantageously increased due to charge and discharge of the parasitic capacitances C1, C2. Further, when the large parasitic capacitances C1, C2 are connected to the wiring 102, there are instances where restrictions are imposed on the operational speed, resulting in a failure to achieve an operation at the target speed.

A similar trouble is also caused by a large parasitic capacitance accompanying with a driver circuit connected to a signal output pad. More specifically, there is interposed, between the signal output pad and an internal circuit, a driver circuit for driving a volt-ammeter used when a functional test is conducted or for driving an external wiring when the semiconductor chip itself is used as a single element. This driver circuit is not necessarily required when connecting, to one another, semiconductor chips in which a high electric current is not required to flow. However, the driver circuit cannot be eliminated in view of the need of a functional test. Accordingly, when a multichip-type semiconductor device is formed, large parasitic capacitances accompanying with the driver circuit inevitably introduce problems such as an increase in power consumption at a high-speed operation and a limited operational speed.

SUMMARY OF THE INVENTION

It is an object of the present invention to provide a semiconductor chip and a multichip-type semiconductor device each of which is capable of reducing the power consumption and achieving a high-speed operation.

A semiconductor chip according to the present invention comprises: an internal circuit formed on a semiconductor substrate; a chip connection pad formed on the semiconductor substrate and used for interchip connection to another semiconductor chip; an other-service-than-interchip-connection pad formed on the semiconductor substrate and used for other service than interchip connection; and a switching circuit formed on the semiconductor substrate for selectively connecting, to the internal circuit, the chip connection pad or the other-service-than-interchip-connection pad.

The "interchip connection" generally refers to the mutual connection of semiconductor chips to be encapsulated in the same package.

The other-service-than-interchip-connection pad may be a pad to which a test probe is connected when conducting a functional test for checking the operation of the semiconductor chip.

The other-service-than-interchip-connection pad may be a pad to which connected is a lead frame pulled out to the outside of the package. The other-service-than-interchip-connection pad may also be a pad commonly used for a test and for connection to the outside of the package.

According to the present invention, there are disposed the chip connection pad used for interchip connection and the other-service-than-interchip-connection pad used for other service than interchip connection, and these pads are selectively connected to the internal circuit by the switching circuit.

Therefore, for example, a protective circuit for protecting the internal circuit is preferably disposed as connected to the other-service-than-interchip-connection pad. According to the arrangement above-mentioned, when conducting a functional test on the semiconductor chip or when it becomes necessary to connect the internal circuit to the outside through the lead frame, the internal circuit is connected to the other-service-than-interchip-connection pad by the switching circuit and the other-service-than-interchip-connection pad is used. This enables the internal circuit to be protected against an abnormal input from the outside. On the other hand, when this semiconductor chip is connected to another semiconductor chip, the switching circuit is operated to connect the internal circuit to the chip connection pad to which the protective circuit is not connected. Thus, the internal circuit is not influenced by the parasitic capacitance accompanying with the protective circuit. This reduces the power consumption and achieves a high-speed operation.

Preferably, the parasitic capacitance accompanying with the chip connection pad is smaller than that accompanying with the other-service-than-interchip-connection pad.

For example, when the protective circuit is connected to the other-service-than-interchip-connection pad and such a protective circuit is not connected to the chip connection pad as done in the arrangement above-mentioned, the parasitic capacitance accompanying with the other-service-than-interchip-connection pad is large, and the parasitic capacitance accompanying with the chip connection pad is much smaller.

For example, when the semiconductor chip incorporates a driver circuit for driving a volt-ammeter for a functional test or an external wiring (mainly, a wiring outside of the package) to be connected through the lead frame, and this driver circuit is connected to the other-service-than-interchip-connection pad, there is present a large parasitic capacitance accompanying with this driver circuit. On the other hand, the chip connection pad is not required to have a driver circuit having such a high electric current as to drive an external wiring or the like. Thus, the parasitic capacitance accompanying with the chip connection pad is much smaller than the parasitic capacitance accompanying with the other-service-than-interchip-connection pad.

Therefore, the switching circuit is suitably switched such that the other-service-than-interchip-connection pad is connected to the internal circuit at the time of a functional test or connection to an external wiring, and that the chip connection pad is connected to the internal circuit at the time of interchip connection. Thus, at the time of interchip connection, the power consumption can be reduced and a high-speed operation can be achieved.

The switching circuit may be arranged to disconnect the internal circuit from the other-service-than-interchip-connection pad and connect the internal circuit to the chip connection pad when the semiconductor chip is being connected to another semiconductor chip through the chip connection pad, and may also be arranged to disconnect the internal circuit from the chip connection pad and connect the internal circuit to the other-service-than-interchip-connection pad when the semiconductor chip is not being connected to another semiconductor chip through the chip connection pad.

According to the arrangement above-mentioned, the chip connection pad is automatically connected to the internal circuit when the semiconductor chip is connected to another semiconductor chip, and the other-service-than-interchip-connection pad is automatically connected to the internal circuit when the semiconductor chip is not connected to another semiconductor chip. Therefore, for example, when the protective circuit is disposed as connected to the other-service-than-interchip-connection pad, the protective circuit can protect the internal circuit against an abnormal input from the outside when the semiconductor chip itself is used as a single element. Further, when the parasitic capacitance accompanying with the chip connection pad is smaller than that accompanying with the other-service-than-interchip-connection pad, an operation with a reduced power consumption and a high-speed operation can be expected when the semiconductor chip is being connected to another semiconductor chip.

Preferably, there is further disposed a switching control input pad formed, as connected to the switching circuit, on the semiconductor substrate, and arranged to receive a switching control signal for controlling the switching operation of the switching circuit.

According to the arrangement above-mentioned, the switching circuit can be switched by supplying a switching control signal from the switching control input pad.

Provision is preferably made such that the switching control input pad is connected to a pad which presents a predetermined voltage in another semiconductor chip, and that the switching circuit disconnects the internal circuit from the other-service-than-interchip-connection pad and connects the internal circuit to the chip connection pad, in response to an input of a predetermined voltage to the switching control input pad.

According to the arrangement above-mentioned, when the semiconductor chip is connected to another semiconductor chip, the predetermined voltage (for example, the power voltage or ground voltage) is given to the switching control input pad from another semiconductor chip. Accordingly, when the semiconductor chip is connected to another semiconductor chip, the chip connection pad can automatically be connected to the internal circuit.

A multichip-type semiconductor device of the present invention is formed by connecting a first semiconductor chip to a second semiconductor chip, the first semiconductor chip having a first chip connection pad used for interchip connection to the second semiconductor chip, the second semiconductor chip including: a second chip connection pad used for interchip connection to the first semiconductor chip; an other-service-than-interchip-connection pad used for other service than interchip connection; a switching circuit for selectively connecting, to an internal circuit of the second semiconductor chip, the second chip connection pad or the other-service-than-interchip-connection pad; and a switching control input pad for receiving a switching control signal for controlling the switching operation of the switching circuit, and the first semiconductor chip further having a switching control output pad to be connected to the switching control input pad for giving a switching control signal.

There may further be disposed interchip connection members for connecting the first and second chip connection pads to each other, and for connecting the switching control input pad and the switching control output pad to each other.

According to the arrangement above-mentioned, the interchip connection members may comprise a metal projection formed on the surface of the first and/or second chip connection pads, and a metal projection formed on the surface of the switching control input pad and/or the switching control output pad. Each of the metal projections may be a bump in the form of a thick layer formed by electrolytic plating or electroless plating, or may be a metal layer such as a metallized layer which is not so high as a bump. According to the arrangement above-mentioned, the connection between the first and second chip connection pads and the connection between the switching control input pad and the switching control output pad, are achieved by bonding the metal projections to each other or by bonding the metal projections and the pads to each other.

The interchip connection members may be bonding wires.

In the multichip-type semiconductor device of the present invention, the effects discussed in connection with the semiconductor chip above-mentioned can be produced for the second semiconductor chip. Accordingly, the multichip-type semiconductor device having the first and second semiconductor chips, can achieve an operation with a reduced power consumption and a high-speed operation.

Further, when a protective circuit is disposed in connection with the other-service-than-interchip-connection pad of the second semiconductor chip, a functional test can be conducted on the second semiconductor chip before the same is connected to the first semiconductor chip to form a multichip-type semiconductor device.

In the second semiconductor chip, the parasitic capacitance accompanying with the second chip connection pad is preferably smaller than that accompanying with the other-service-than-interchip-connection pad.

This contributes to a reduction in power consumption and a higher-speed operation of the multichip-type semiconductor device.

Provision is preferably made such that the switching circuit is arranged to disconnect the internal circuit from the other-service-than-interchip-connection pad and connect the internal circuit to the second chip connection pad when the switching circuit receives a switching control signal generated by the switching control output pad of the first semiconductor chip, and is also arranged to disconnect the internal circuit from the second chip connection pad and connect the internal circuit to the other-service-than-interchip-connection pad when the switching circuit does not receive a switching control signal generated by the switching control output pad of the first semiconductor chip.

According to the arrangement above-mentioned, the switching circuit can suitably automatically be switched.

The second semiconductor chip may be piled up on and bonded to the surface of the first semiconductor chip, and the first and second semiconductor chips may be bonded to each other in a chip-on-chip structure.

According to the arrangement above-mentioned, the wiring length (a connection member comprising a metal projection such as a bump) between the first and second chip connection pads is very short. This further reduces the power consumption and increases the operational speed.

These and other features, objects and advantages of the present invention will be more fully apparent from the following detailed description set forth below when taken in conjunction with the accompanying drawings.

DESCRIPTION OF THE PREFERRED EMBODIMENTS

Figure 1:
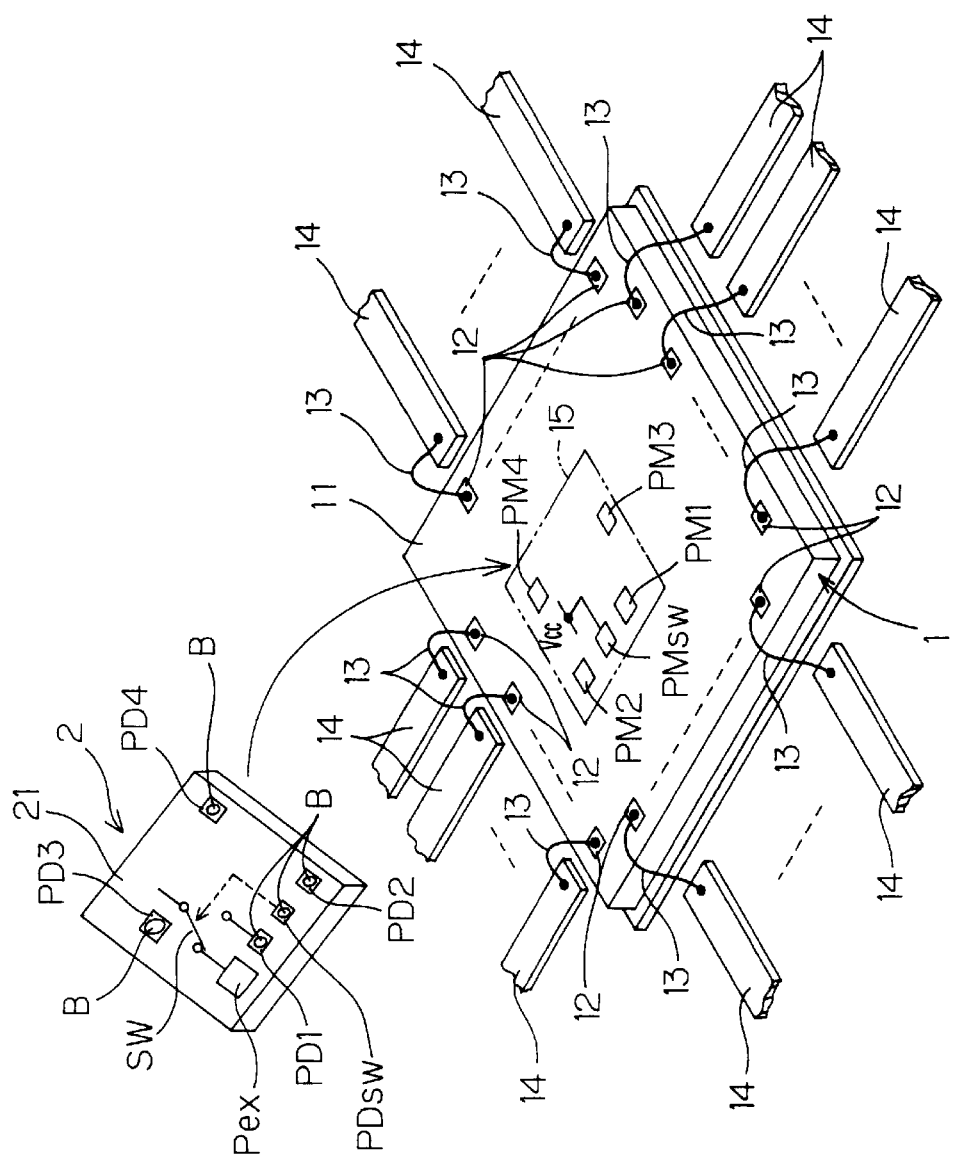
FIG. 1 is an exploded perspective view of a multichip-type semiconductor device according to an embodiment of the present invention.
Figure 2:
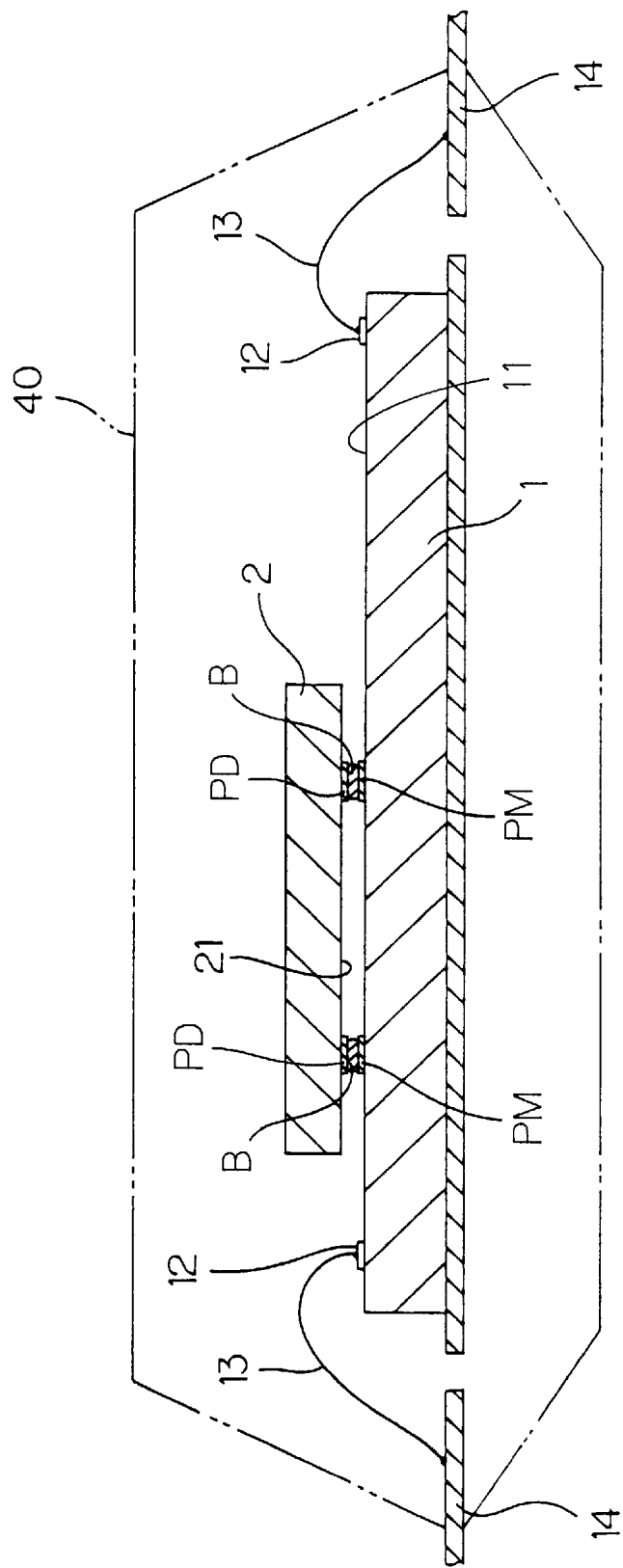
FIG. 2 is a section view of the multichip-type semiconductor device in FIG. 1.

FIG. 1 is an exploded perspective view of a semiconductor device according to an embodiment of the present invention, while FIG. 2 is a section view of the semiconductor device in FIG. 1. This semiconductor device has a so-called chip-on-chip structure in which a daughter chip or secondary chip 2 serving as a second semiconductor chip is being piled up on and bonded to the surface 11 of a mother chip or primary chip 1 serving as a first semiconductor chip. With external connection lead frames 14 pulled out, this chip-on-chip-structure multichip-type semiconductor device is resin-molded and housed in a package 40.

The primary chip 1 is made of a silicon chip for example. The surface 11 is an active-layer-area-side surface of the semiconductor substrate serving as the base body of the primary chip 1, functional elements such as transistors and the like being mounted on this active-layer-area-side surface. The top of the surface 11 is coated with a protective layer comprised of an insulating material. At predetermined positions on this protective layer, a plurality of external connection pads 12 are disposed, as projecting from the surface 11, in the vicinity of the peripheral edge of the primary chip surface 11 substantially in the form of a rectangle in plan view. The external connection pads 12 are connected to the lead frames 14 by bonding wires 13.

The primary chip 1 is provided at an inner zone thereof with a bonding zone 15 for connection to the secondary chip 2. Formed at this bonding zone 15 are a plurality of chip connection pads PM1, PM2, PM3, PM4, . . . (first chip connection pads) (hereinafter referred to as "chip connection pads PM" when these pads are collectively referred to) for chip-connection to the secondary chip 2 (In FIG. 1, only four pads PM are shown).

The secondary chip 2 is made of a silicon chip for example. The surface 21 is an active-layer-area-side surface of the semiconductor substrate serving as the base body of the secondary chip 2, functional elements such as transistors and the like being formed on this active-layer-area-side surface. The top of the surface 21 is coated with a protective layer comprised of an insulating material. Formed on this protective layer are a plurality of chip connection pads PD1, PD2, PD3, PD4, . . . (second chip connection pads) (hereinafter referred to as "chip connection pads PD" when these pads are collectively referred to) for chip-connection to the primary chip 1 (In FIG. 1, only four pads PD are shown). Further, formed on the surface 21 are external connection pads Pex (other-service-than-interchip-connection pads) to be used for other connection than interchip connection, i.e., for connection to a test probe for a functional test or connection to lead frames pulled out from the resin package when the secondary chip 2 itself is used as a single element. FIG. 1 shows only one external connection pad Pex corresponding to the chip connection pad PD1, but one external connection pad Pex is disposed for each of all the chip connection pads PD.

Bumps B made of a oxidation-resistant metal such as gold, lead, platinum, silver or iridium, are formed on the chip connection pads PD of the secondary chip 2. These bumps B form metal projections serving as interchip connection members.

The secondary chip 2 is bonded to the primary chip 1 with the surface 21 facing the surface 11 of the primary chip 1. More specifically, with the bumps B respectively coming in contact with the chip connection pads PM of the bonding zone 15, the primary chip 1 and the secondary chip 2 are mutually contact-bonded to each other. At the time of contact bonding, ultrasonic vibration may be given to the primary chip 1 and/or the secondary chip 2 as necessary. This achieves a secure bonding between the bumps B and the chip connection pads PM.

The chip connection pads PD and the corresponding external connection pads Pex are connected, through switching circuits SW, to an internal circuit, to be discussed later, formed on the semiconductor substrate of the secondary chip 2. Formed on the surface 21 of the secondary chip 2 is a switching control input pad PDsw to which entered is a switching control signal to be given to the switching circuits SW. A bump B is also formed on the surface of the switching control input pad PDSw.

One switching circuit SW is formed for each of the pairs of the chip connection pads PD and the external connection pads Pex. Provision may be made such that the switching control signal from the switching control input pad PDsw is commonly given to the switching circuits SW.

Formed on the surface 11 of the primary chip 1 is a switching control output pad PMsw to be connected to the switching control input pad PDsw through the bump B. The power voltage Vcc is given to the switching control output pad PMsw.

Figure 3:
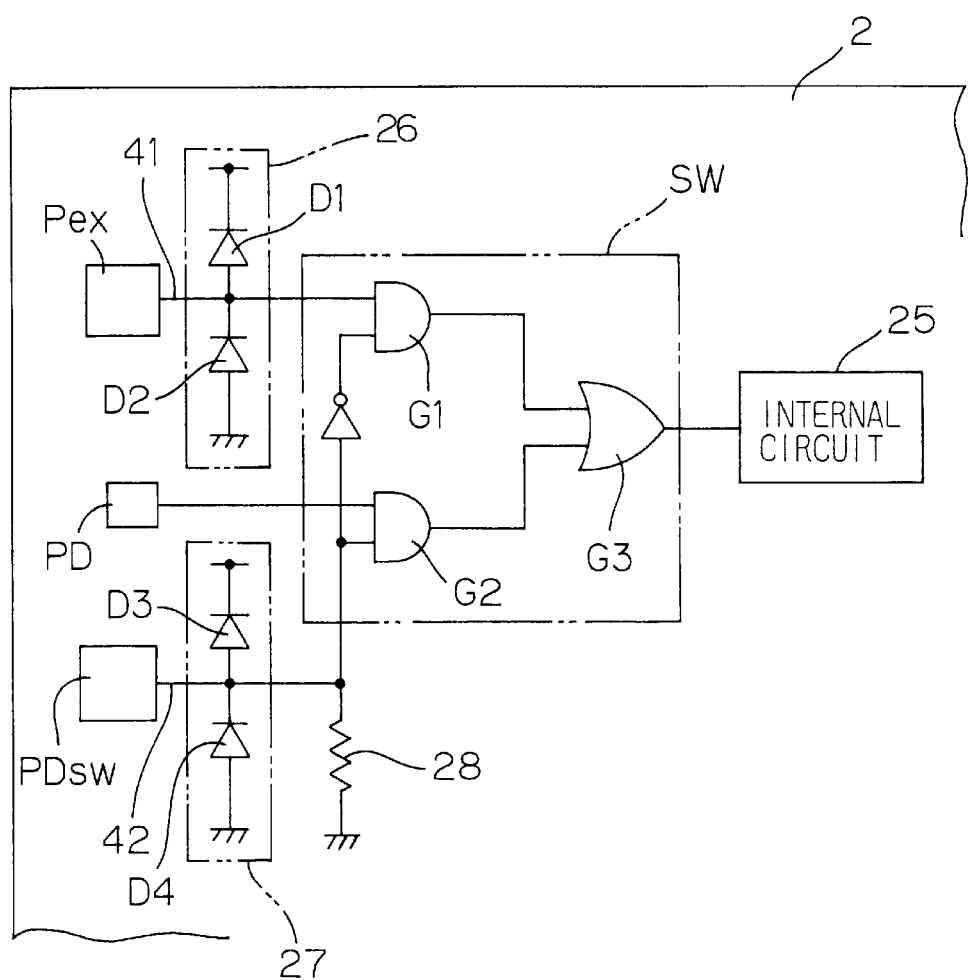
FIG. 3 is a block diagram illustrating the electric arrangement of a signal input section of the secondary chip in the multichip-type semiconductor device in FIG. 1.

FIG. 3 is a block diagram illustrating the electric arrangement of a signal input section of the secondary chip 2. More specifically, FIG. 3 shows the arrangement of the signal input section for an internal circuit 25. Formed on the semiconductor substrate serving as the base body of the secondary chip 2 is the internal circuit 25 comprising a logic circuit. This internal circuit 25 is arranged to be selectively connected to the external connection pads Pex or the chip connection pads PD by the switching circuits SW formed on the semiconductor substrate. Provision is made such that a switching control signal is entered from the switching control output pad PMsw to the switching circuits SW.

A wiring 41 is disposed between each external connection pad Pex and each switching circuit SW. A diode D1 is connected to each wiring 41 between the same and the power line, while a diode D2 is connected to each wiring 41 between the same and the ground line. These diodes D1, D2 form surge protective circuits 26 arranged such that, when a surge voltage is applied through the external connection pads Pex, the diodes D1, D2 are conducted to absorb this surge voltage to prevent the internal circuit 25 from being damaged.

The switching control output pad PMsw has a similar arrangement. More specifically, a wiring 42 is disposed between the switching control input pad PDsw and the switching circuits SW. A diode D3 is connected to the wiring 42 between the same and the power line, while a diode D4 is connected to the wiring 42 between the same and the ground line. These diodes D3, D4 form a surge protective circuit 27. A pull-down resistance 28 is connected to the wiring 42. Accordingly, the wiring 42 is maintained at the ground potential when no signal is entered into the switching control input pad PDsw.

No surge protective circuits are disposed for the chip connection pads PD. Accordingly, the chip connection pads PD do not accompany large parasitic capacitances, while the external connection pads Pex accompany large parasitic capacitances of the diodes D1, D2.

Each switching circuit SW comprises: an AND gate G1 to which entered are an input signal from each external connection pad Pex and an inversion signal of a switching control signal from the switching control input pad PDsw; an AND gate G2 to which entered are an input signal from each chip connection pad PD and a switching control signal from the switching control input pad PDsw; and an OR gate G3 to which entered are output signals from the AND gate G1 and the AND gate G2. Provision is made such that an output signal of each OR gate G3 is supplied to the internal circuit 25.

When the secondary chip 2 is not being bonded to the primary chip 1, the wiring 42 connected to the switching control input pad PDsw presents the ground potential. Accordingly, each AND gate G1 allows a signal from each external connection pad Pex to pass therethrough, but each AND gate G2 prevents a signal from each chip connection pad PD from passing therethrough. Therefore, only the input signal from each external connection pad Pex is entered into the internal circuit 25 through each OR gate G3. In other words, each switching circuit SW connects the internal circuit 25 and each external connection pad Pex to each other, but disconnects the internal circuit 25 from each chip connection pad PD.

On the other hand, when the secondary chip 2 is being bonded to the primary chip 1, the switching control input pad PDsw is connected to the switching control output pad PMsw of the primary chip 1 and receives the power voltage Vcc from the primary chip 1. Accordingly, each AND gate G1 prevents an input signal from each external connection pad Pex from passing therethrough, but each AND gate G2 allows an input signal from each chip connection pad PD to pass therethrough. Therefore, only the input signal from each chip connection pad PD is entered into the internal circuit 25 through each OR gate G3. In other words, each switching circuit SW disconnects the internal circuit 25 from each external connection pad Pex, but connects the internal circuit 25 and each chip connection pad PD to each other.

Figure 4:
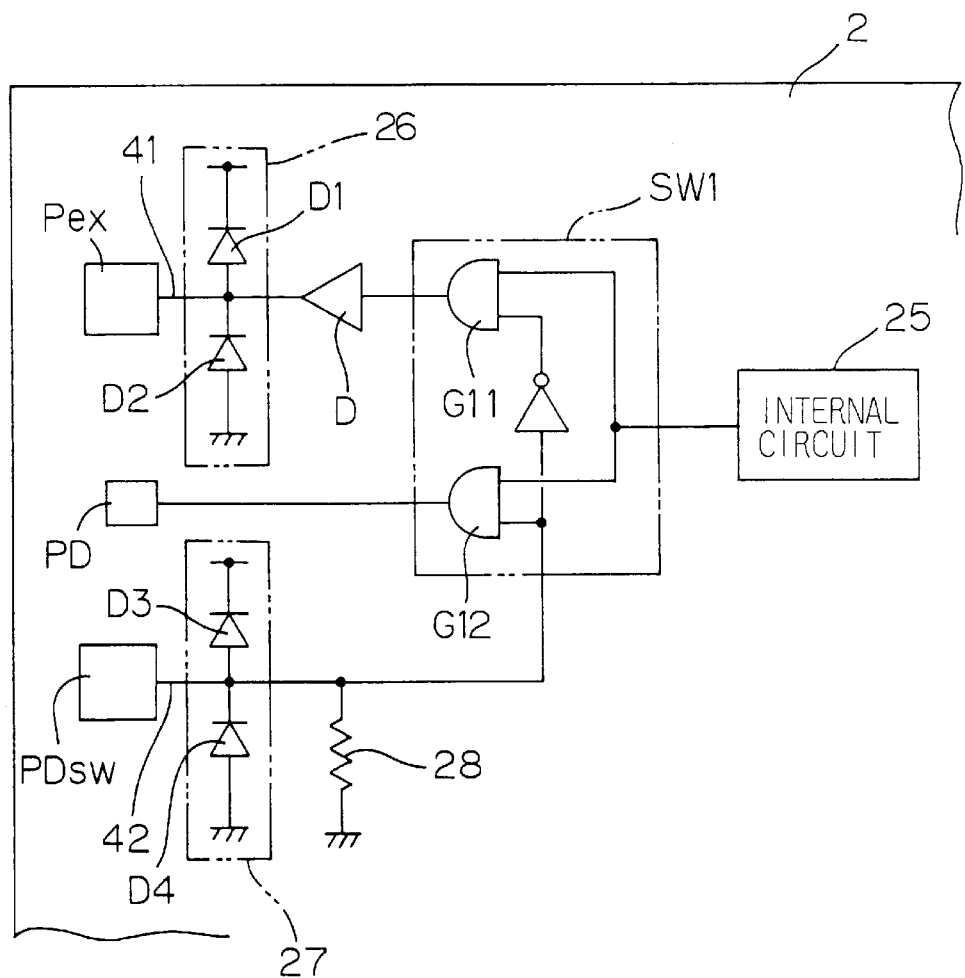
FIG. 4 is a block diagram illustrating the electric arrangement of a signal output section of the secondary chip in the multichip-type semiconductor device in FIG. 1.

FIG. 4 is a block diagram illustrating the electric arrangement of a signal output section of the secondary chip 2. More specifically, FIG. 4 shows the arrangement of the signal output section for the internal circuit 25. This signal output section has an arrangement similar to that of the signal input section shown in FIG. 3. In FIG. 4, therefore, like parts are designated by like reference numerals used in FIG. 3, and a repeated description is omitted.

Each switching circuit SW1 in the signal output section has an arrangement different from that of each switching circuit SW of the signal input section. More specifically, each switching circuit SW1 in the signal output section has a pair of AND gates G11, G12 to which an output signal of the internal circuit 25 is given. Provision is made such that an output of each AND gate G11 is given to each external connection pad Pex through each driver circuit D, and that an output of each AND gate G12 is given to each chip connection pad PD.

Each driver circuit D is arranged to drive a volt-ammeter connected to the external connection pads Pex when conducting a functional test for checking the operation of the internal circuit 25, or to drive each external wiring connected to the secondary chip 2 through a lead frame when the secondary chip 2 itself is used as a single element.

A switching control signal from the switching control input pad PDsw is entered into the AND gates G12, and its inversion signal is entered into the AND gates G11.

When the secondary chip 2 is not being bonded to the primary chip 1, the wiring 42 connected to the switching control input pad PDsw presents the ground potential. Accordingly, each AND gate G11 allows an output signal of the internal circuit 25 to be sent to each external connection pad Pex, but each AND gate G12 prevents an output signal of the internal circuit 25 from being sent to each chip connection pad PD. Therefore, the output signal of the internal circuit 25 is sent only to each external connection pad Pex. In other words, each switching circuit SW1 connects the internal circuit 25 and each external connection pad Pex to each other, but disconnects the internal circuit 25 from each chip connection pad PD.

When the secondary chip 2 is being bonded to the primary chip 1, the switching control input pad PDsw is connected to the switching control output pad PMsw of the primary chip 1 and receives the power voltage Vcc from the primary chip 1. Accordingly, each AND gate G11 prevents an output signal of the internal circuit 25 from being sent to each external connection pad Pex, but each AND gate G12 allows an output signal of the internal circuit 25 to be sent to each chip connection pad PD. Therefore, the output signal of the internal circuit 25 is only sent to each chip connection pad PD. In other words, each switching circuit SW1 disconnects the internal circuit 25 from each external connection pad Pex, but connects the internal circuit 25 and each chip connection pad PD to each other.

Before the secondary chip 2 is bonded to the primary chip 1 to form a semiconductor device having a chip-on-chip structure, a functional test is conducted on the secondary chip 2 itself as a single element. At the time of this functional test, test probes are to be applied to the external connection pads Pex connected to the internal circuit 25 through the switching circuits SW, SW1. At this time, if a surge voltage is entered, the surge protective circuits 26 operate to prevent the surge voltage from entering into the internal circuit 25. In the signal output unit, the driver circuits D are interposed between the external connection pads Pex and the switching circuits SW1. The actuation of the driver circuits D enables a volt-ammeter to be driven favorably through the test probes connected to the external connection pads Pex.

On the other hand, when the secondary chip 2 is bonded to the primary chip 1 to form a chip-on-chip-structure semiconductor device, the external connection pads Pex are disconnected from the internal circuit 25. The electric connection between the internal circuit 25 and the primary chip 1, is solely conducted through the chip connection pads PD. No surge protective circuits are connected to the chip connection pads PD. Accordingly, there are accompanied, by the chip connection pads PD, only parasitic capacitances smaller than those accompanied by the external connection pads Pex. This not only reduces the power consumption, but also enables a high-speed operation.

Further, in the signal output section, there is no need of disposing a driver circuit for each chip connection pad PD. The parasitic capacitances of output transistors of the AND gates G12 are remarkably smaller than those of output transistors of the driver circuits D. Accordingly, the parasitic capacitances at the side of the chip connection pads PD are remarkably smaller than those at the side of the external connection pads Pex for which the driver circuits Dare disposed. Thus, as compared with prior art using only the current passages having driver circuits, the secondary chip 2 can achieve a higher-speed operation and an operation with less power consumption. As a result, there is achieved a multichip-type semiconductor device high in operational speed and low in power consumption.

Further, each surge protective circuit 26 is disposed for each external connection pad Pex, and each driver circuit D is disposed on each wiring 41 for each external connection pad Pex of the signal output unit. Therefore, the secondary chip 2 itself can be used as a single element. More specifically, the secondary chip 2 can be used as a chip incorporated in a multichip-type semiconductor device, and can also be used as a single element. When the secondary chip 2 is used as incorporated in a multichip-type semiconductor device, the multichip-type semiconductor device achieves a high-speed operation and an operation with a reduced power consumption.

Figure 5:
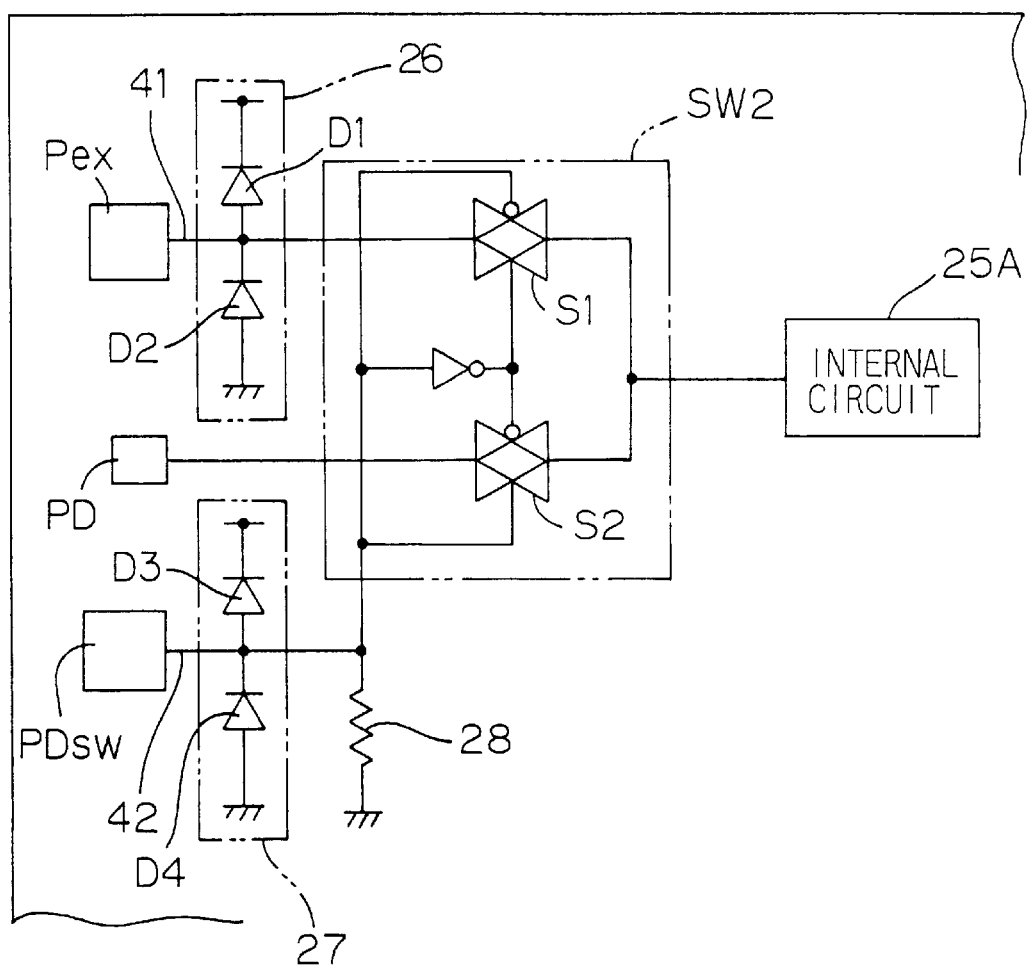
FIG. 5 is a block diagram illustrating the electric arrangement of a secondary chip having an internal circuit having an analog circuit.
Figure 6:
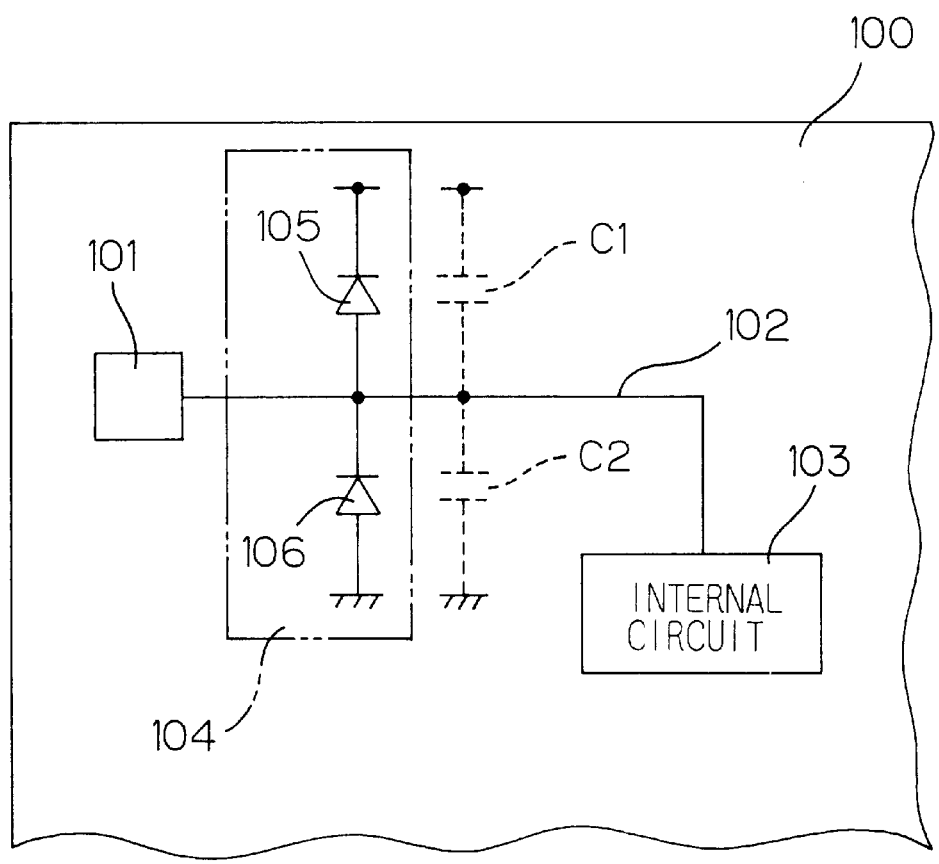
FIG. 6 is a block diagram illustrating the electric arrangement relating to a pad of a semiconductor chip of prior art.

FIG. 5 is a block diagram for illustrating the arrangement of another embodiment of the present invention. FIG. 5 shows another example of the secondary chip 2 of the chip-on-chip-structure multichip-type semiconductor device shown in FIGS. 1 and 2, illustrating the arrangement of a signal input section for the internal circuit. In FIG. 5, like parts are designated by like reference numerals used in FIG. 3, and a repeated description is omitted.

In the embodiment in FIG. 5, an internal circuit 25A having an analog circuit is formed on a semiconductor substrate serving as a base body of the secondary chip 2. A switching circuit SW2 is interposed between the internal circuit 25A and, each external connection pad Pex and each chip connection pad PD. Each switching circuit SW2 has a pair of analog switches S1, S2. Each analog switch S1 is arranged to make and break the connection between each external connection pad Pex and the internal circuit 25A. Each analog switch S2 is arranged to make and break the connection between each chip connection pad PD and the internal circuit 25A. Provision is made such that a switching control signal from the switching control input pad PDsw is entered, as inverted, into a control input terminal of each analog switch S1. Also, provision is made such that a switching control signal from the switching control input pad PDsw is entered, as it is, into a control input terminal of each analog switch S2.

When the secondary chip 2 is not being bonded to the primary chip 1, the wiring 42 connected to the switching control input pad PDsw presents the ground potential. Accordingly, each analog switch S1 is conducted, but each analog switch S2 is shut off. Therefore, the internal circuit 25A is connected only to each external connection pad Pex, and disconnected from each chip connection pad PD. In such a state, a functional test can be conducted on the internal circuit 25A with a test probe connected to each external connection pad Pex. At this time, if an excessive surge voltage is entered, the surge voltage is absorbed by the surge protective circuit 26, thus preventing the internal circuit 25A from being damaged.

On the other hand, when the secondary chip 2 is being bonded to the primary chip 1, the power voltage Vcc is given to the switching control input pad PDsw. Accordingly, each analog switch S1 is shut off, while each analog switch S2 is conducted. Thus, the internal circuit 25A is connected only to the chip connection pads PD and disconnected from the external connection pads Pex. This means that the internal circuit 25A is connected, with the parasitic capacitance being very small, to the primary chip 1. Thus, there is achieved a multichip-type semiconductor device capable of operating at high speed with low power consumption.

For using the secondary chip 2 itself as a single chip, the external connection pads Pex may be connected, by bonding wires, to the lead frames pulled out to the outside of the mold-resin package. According to the arrangement above-mentioned, even though a surge voltage is applied through the lead frames, this surge voltage is absorbed by the surge protective circuits 26, thus preventing the internal circuit 25A from being damaged.

On the other hand, a signal output section for signal output from the internal circuit 25A, has an arrangement substantially identical with that of the signal input section above-mentioned. However, driver circuits are disposed, as necessary, on the wirings connected to the external connection pads Pex. In such a case, when the secondary chip 2 is bonded to the primary chip 1, the parasitic capacitances of the driver circuits are shut off from the internal circuit 25A. This assures a high-speed operation with low power consumption.

Embodiments of the present invention have thus been discussed, but the present invention can be embodied in other forms. For example, the bumps B are formed in the secondary chip 2 in the embodiment above-mentioned, but similar bumps may also be formed at the side of the primary chip 1. More specifically, bumps may be formed at both sides of the primary chip 1 and the secondary chip 2 and may be bonded to each other, thus achieving a chip-on-chip bonding between the primary chip 1 and the secondary chip 2.

Each metal projection for bonding the primary chip 1 and the secondary chip 2 to each other, is not required to be so high in height. Accordingly, each metal projection may be formed by a thin metal layer such as a metallized layer, in addition to a bump generally formed by electrolytic plating or electroless plating.

In the embodiment above-mentioned, the description has been made of the arrangement in which one secondary chip 2 is bonded to the surface 11 of the primary chip 1. However, two or more secondary chips may be bonded to the surface 11 of the primary chip 1.

In the embodiment above-mentioned, there has been discussed, as an example, a chip-on-chip-structure multichip-type semiconductor device in which the primary chip 1 and the secondary chip 2 are bonded to each other through the bumps B. However, the present invention may also be applied to a chip-on-chip-structure multichip-type semiconductor device in which the secondary chip reverse face (which is opposite to the active layer area) is bonded to the surface 11 of the primary chip 1 and the chip connection pads are connected by wire bonding. Further, when semiconductor chips are connected to each other by wire bonding, the multichip-type semiconductor device is not necessarily be of the chip-on-chip structure type. Further, the present invention may also be applied to a semiconductor device in which a plurality of semiconductor chips are bonded onto a printed circuit board and the connection among the semiconductor chips is achieved through this printed circuit board.

In the embodiment above-mentioned, each of the primary chip 1 and the secondary chip 2 is a chip made of silicon. However, the material of each semiconductor chip is not limited to silicon. A semiconductor chip made of other optional semiconductor material such as a gallium-arsenic compound semiconductor, a gallium-phosphorus compound semiconductor, a germanium semiconductor or the like, may also be applied to a semiconductor device of the present invention. The first and second semiconductor chips may be the same or different from each other in semiconductor material.

Embodiments of the present invention have been discussed in detail, but these embodiments are mere specific examples for clarifying the technical contents of the present invention. Therefore, the present invention should not be construed as limited to these specific examples. The spirit and scope of the present invention are limited only by the appended claims.

This application claims priority benefits under 35 USC §119 of Japanese Patent Application Serial No. 11-22690, filed on Jan. 29, 1999, the disclosure of which is incorporated herein by reference.

What is claimed is:

1. A semiconductor chip, comprising:
   an internal circuit formed on a semiconductor substrate;
   a chip connection pad formed on the semiconductor substrate and used for interchip connection to another semiconductor chip;
   an other-service-than-interchip-connection pad formed on the semiconductor substrate and used for other service than interchip connection; and
   a switching circuit formed on the semiconductor substrate for selectively connecting, to the internal circuit, the chip connection pad or the other-service-than-interchip-connection pad, wherein
   the switching circuit is arranged to disconnect the internal circuit from the other-service-than-interchip-connection pad and connect the internal circuit to the chip connection pad when the semiconductor chip is being connected to another semiconductor chip is being connected to another semiconductor chip through the chip connection pad, and is also arranged to disconnect the internal circuit from the chip connection pad and connect the internal circuit to the other-service-than-interchip-connection pad when the semiconductor chip is not being connected to another semiconductor chip through the chip connection pad.

2. A semiconductor chip according to claim 1, wherein the other-service-than-interchip-connection pad is a pad to which a test probe is connected when conducting a functional test for checking an operation of the semiconductor chip.

3. A semiconductor chip according to claim 1, wherein the other-service-than-interchip-connection pad is a pad to which connected is a lead frame pulled out to outside of a package housing the semiconductor chip.

4. A semiconductor chip according to claim 1, further comprising a protective circuit formed, as connected to the other-service-than-interchip-connection pad, on the semiconductor substrate, and arranged to protect the internal circuit against an abnormal input from the other-service-than-interchip-connection pad.

5. A semiconductor chip according to claim 1, wherein a parasitic capacitance accompanying with the chip connection pad is smaller than that accompanying with the other-service-than-interchip-connection pad.

6. A semiconductor chip according to claim 1, further comprising a switching control input pad formed, as connected to the switching circuit, on the semiconductor substrate, and arranged to receive a switching control signal for controlling a switching operation of the switching circuit.

7. A multichip-type semiconductor device formed by connecting a first semiconductor chip to a second semiconductor chip,
   the first semiconductor chip having a first chip connection pad used for interchip connection to the second semiconductor chip,
   the second semiconductor chip including: a second chip connection pad used for interchip connection to the first semiconductor chip; an other-service-than-interchip-connection pad used for other service than interchip connection; a switching circuit for selectively connecting, to an internal circuit of the second semiconductor chip, the second chip connection pad or the other-service-than-interchip-connection pad; and a switching control input pad for receiving a switching control signal for controlling a switching operation of the switching circuit, and
   the first semiconductor chip further having a switching control output pad to be connected to the switching control input pad for giving a switching control signal.

8. A multichip-type semiconductor device according to claim 7, wherein the other-service-than-interchipconnection pad is a pad to which a test probe is connected when conducting a functional test for checking an operation of the second semiconductor chip.

9. A multichip-type semiconductor device according to claim 7, wherein the other-service-than-interchip-connection pad is a pad to which connected is a lead frame pulled out from a package housing the second semiconductor chip.

10. A multichip-type semiconductor device according to claim 7, further comprising interchip connection members for connecting the first and second chip connection pads to each other, and for connecting the switching control input pad and the switching control output pad to each other.

11. A multichip-type semiconductor device according to claim 10, wherein the interchip connection members include a metal projection formed on a surface of the first and/or second chip connection pads, and a metal projection formed on a surface of the switching control input pad and/or the switching control output pad.

12. A multichip-type semiconductor device according to claim 7, wherein the second semiconductor chip further includes a protective circuit formed as connected to the other-service-than-interchip-connection pad and arranged to protect the internal circuit against an abnormal input from the other-service-than-interchip-connection pad.

13. A multichip-type semiconductor device according to claim 7, wherein in the second semiconductor chip, a parasitic capacitance accompanying with the second chip connection pad is smaller than that accompanying with the other-service-than-interchip-connection pad.

14. A multichip-type semiconductor device according to claim 7, wherein the switching circuit is arranged to disconnect the internal circuit from the other-service-than-interchip-connection pad and connect the internal circuit to the second chip connection pad when the switching circuit receives a switching control signal from the switching control output pad of the first semiconductor chip, and is also arranged to disconnect the internal circuit from the second chip connection pad and connect the internal circuit to the other-service-than-interchip-connection pad when the switching circuit does not receive a switching control signal from the switching control output pad of the first semiconductor chip.

15. A multichip-type semiconductor device according to claim 7, wherein the second semiconductor chip is piled up on and bonded to a surface of the first semiconductor chip, and the first and second semiconductor chips are bonded to each other in a chip-on-chip structure.

16. A semiconductor chip, comprising:
  an internal circuit formed on a semiconductor substrate;
  a chip connection pad formed on the semiconductor substrate and used for interchip connection to another semiconductor chip;
  an other-service-than-interchip-connection pad formed on the semiconductor substrate and used for other service than interchip connection;
  a switching circuit formed on the semiconductor substrate for selectively connecting, to the internal circuit, the chip connection pad or the other-service-than-interchip-connection pad; and
  a switching control input pad formed, as connected to the switching circuit, on the semiconductor substrate, and arranged to receive a switching control signal for controlling a switching operation of the switching circuit, wherein
  the switching control input pad is to be connected to a pad which presents a predetermined voltage in another semiconductor chip, and
  the switching circuit disconnects the internal circuit from the other-service-than-interchip-connection pad and connects the internal circuit to the chip connection pad, in response to an input of the predetermined voltage to the switching control input pad.

* * * * *